US010418227B2

(12) United States Patent
Seok et al.

(10) Patent No.: US 10,418,227 B2
(45) Date of Patent: Sep. 17, 2019

(54) PLASMA EQUIPMENT FOR TREATING POWDER

(71) Applicant: KOREA BASIC SCIENCE INSTITUTE, Daejeon (KR)

(72) Inventors: Dong Chan Seok, Daejeon (KR); Yong Ho Jung, Seoul (KR); Hyun Young Jeong, Gunsan-si (KR)

(73) Assignee: KOREA BASIC SCIENCE INSTITUTE, Daejeon (KR)

( * ) Notice: Subject to any disclaimer, the term of this patent is extended or adjusted under 35 U.S.C. 154(b) by 168 days.

(21) Appl. No.: 15/719,128

(22) Filed: Sep. 28, 2017

(65) Prior Publication Data

US 2018/0019105 A1 Jan. 18, 2018

Related U.S. Application Data

(62) Division of application No. 14/409,399, filed as application No. PCT/KR2013/011273 on Dec. 6, 2013, now abandoned.

(30) Foreign Application Priority Data

Dec. 10, 2012 (KR) ........................ 10-2012-0142764

(51) Int. Cl.
*B01J 19/08* (2006.01)
*H01J 37/32* (2006.01)
*H05H 1/24* (2006.01)

(52) U.S. Cl.
CPC ....... *H01J 37/32532* (2013.01); *B01J 19/088* (2013.01); *H01J 37/32009* (2013.01);
(Continued)

(58) Field of Classification Search
CPC ...................................................... B01J 19/088
(Continued)

(56) References Cited

U.S. PATENT DOCUMENTS

| 7,397,013 B2 | 7/2008 | Jones et al. |
| 2007/0098614 A1 | 5/2007 | Iida et al. |

(Continued)

FOREIGN PATENT DOCUMENTS

| JP | 59-019539 A | 2/1984 |
| JP | 08-035070 | 2/1996 |

(Continued)

OTHER PUBLICATIONS

International Search Report issued in PCT Application No. PCT/KR2013/011273, dated Feb. 10, 2014.

*Primary Examiner* — Roberts P Culbert
(74) *Attorney, Agent, or Firm* — Norton Rose Fulbright US LLP

(57) ABSTRACT

A powder plasma processing apparatus is disclosed. The powder plasma processing apparatus is a powder plasma processing apparatus of a circular surface discharge plasma module, and the apparatus includes a plate-like electrode layer serving as an external surface of the circular surface discharge plasma module, an insulating layer disposed on an internal surface of the plate-like electrode layer, and a plasma generating electrode disposed on the insulating layer, wherein the circular surface discharge plasma module rotates, an alternating voltage is applied to the plasma generating electrode and the plate-like electrode layer to generate plasma around the plasma generating electrode, and a powder for plasma processing is processed by the plasma within the circular surface discharge plasma module.

12 Claims, 2 Drawing Sheets

(52) U.S. Cl.
CPC .. *H01J 37/32348* (2013.01); *H01J 37/32568* (2013.01); *H05H 1/2406* (2013.01); *B01J 2219/083* (2013.01); *B01J 2219/0879* (2013.01); *H05H 2001/2412* (2013.01); *H05H 2001/2431* (2013.01)

(58) Field of Classification Search
USPC .................................................. 156/345.24
See application file for complete search history.

(56) References Cited

U.S. PATENT DOCUMENTS

2008/0056928 A1    3/2008  Bunce et al.
2012/0145041 A1*   6/2012  Walters .................. B01J 19/088
                                              106/472

FOREIGN PATENT DOCUMENTS

JP       2004089753 A    3/2004
JP          5089521 B2    9/2012
KR       2001-0068436    7/2001

* cited by examiner

[Fig. 1]
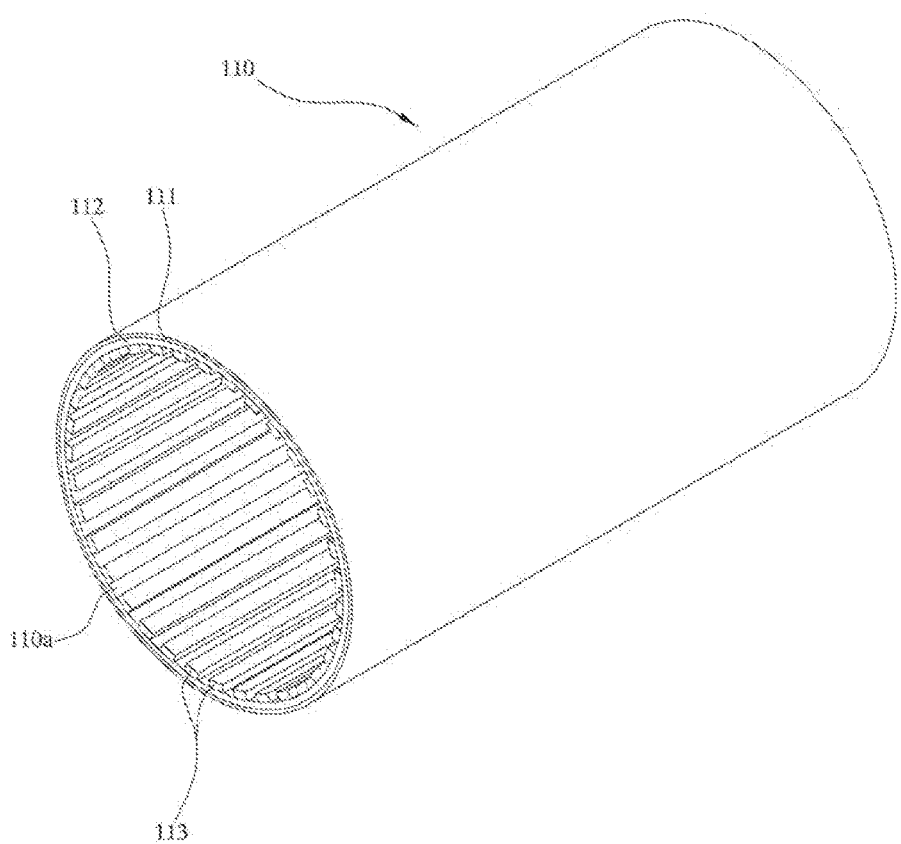

[Fig. 2]
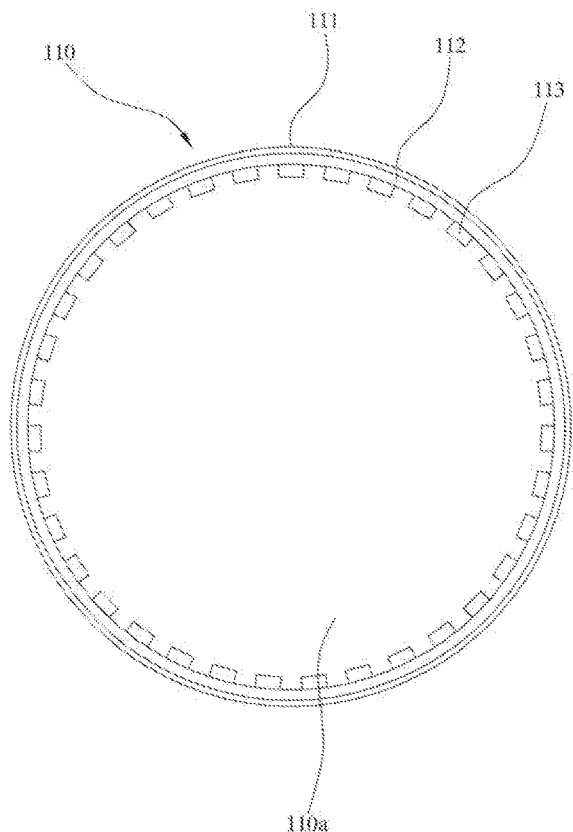
[Fig. 3]
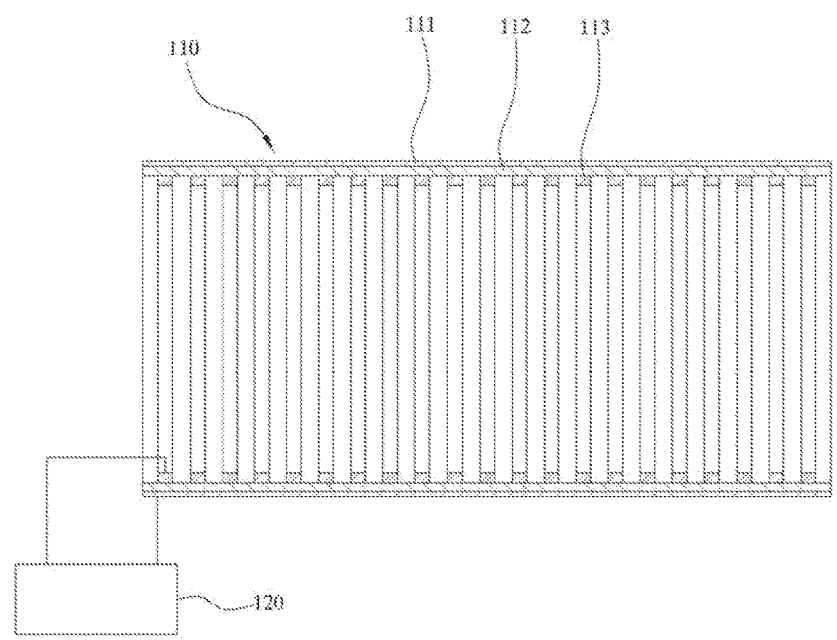

PLASMA EQUIPMENT FOR TREATING POWDER

CROSS-REFERENCED TO RELATED APPLICATION

This application is a divisional of U.S. patent application Ser. No. 14/409,399, filed Dec. 18, 2014, which is a national phase application under 35 U.S.C. § 371 of International Patent Application No. PCT/KR2013/011273 filed Dec. 6, 2013, which claims priority to Korean Patent Application No. 10-2012-0142764, filed Dec. 10, 2012. The entire contents of the referenced patent applications are incorporated into the present application by reference.

BACKGROUND

1. Field of the Invention

The present invention relates to a powder plasma processing apparatus, and more particularly, to a powder plasma processing apparatus that uniformly processes a powder using a circular surface discharge plasma module.

2. Discussion of Related Art

Plasma is an ionized gas. When a gas consisting of atoms or molecules is excited using energy, plasma consisting of electrons, decomposed gases, photons, and the like is generated. This plasma is widely used for surface treatment of objects to be processed (e.g., a substrate or the like).

Pulsed corona discharge and dielectric film discharge are well known as techniques of generating plasma. Pulsed corona discharge is a technique that uses a high-voltage pulse power supply to generate plasma, and dielectric film discharge is a technique in which a dielectric is formed on at least one of two electrodes and a power having a frequency of several Hz to several tens of Hz is applied to the two electrodes to generate plasma.

A dielectric barrier discharge (DBD) technique is employed as the representative dielectric film discharge. In a plasma processing apparatus using the DBD technique, when an object to be processed is disposed between plate electrodes and an inert gas is used to cause the dielectric film discharge to occur, plasma is generated and then brought into contact with a surface of the object to be processed, thereby processing the surface of the object to be processed.

However, in the plasma processing apparatus described above, since the object to be processed is disposed between the plate electrodes, although it is not difficult to process one surface or both surfaces when the object to be processed is a plate-like member, it is difficult to process an entire surface of the object to be processed when the object to be processed is a powder. A plasma processing apparatus for processing the object to be processed is thus required when the object to be processed is a powder.

A plasma processing apparatus of the prior art for processing an object to be processed when the object to be processed is a powder is disclosed in an application filed with the title "Tubular plasma processing apparatus" as Korean application No. of 10-2012-0078234 by the present inventors. According to this literature, it is possible to perform surface treatment on a powder but difficult to perform uniform processing on the powder.

The present inventors have recognized the problems of the prior art and solved the problems of the conventional plasma processing apparatus through research. Further, the present inventors have developed a powder plasma processing apparatus that can provide a method of controlling a contact time between an object to be processed and plasma and efficiently performing uniform processing on a powder.

SUMMARY OF THE INVENTION

The present invention is directed to a powder plasma processing apparatus of a circular surface discharge plasma module, the apparatus including: a plate-like electrode layer serving as an external surface of the circular surface discharge plasma module; an insulating layer disposed on an internal surface of the plate-like electrode layer; and a plasma generating electrode disposed on the insulating layer, wherein the circular surface discharge plasma module rotates, an alternating voltage is applied to the plasma generating electrode and the plate-like electrode layer to generate a plasma around the plasma generating electrode, and a powder for plasma processing is processed by the plasma within the circular surface discharge plasma module.

For example, a plurality of the plasma generating electrodes are arranged on the insulating layer at intervals in the circumferential direction of the surface discharge plasma module, and extend in the longitudinal direction of the surface discharge plasma module.

As another example, a plurality of the plasma generating electrodes are arranged on the insulating layer at intervals in the longitudinal direction of the surface discharge plasma module, and extend in the circumferential direction of the surface discharge plasma module.

According to an embodiment of the present invention, a high voltage is applied to the plate-like electrode layer, and the plasma generating electrode is a ground electrode.

According to another embodiment of the present invention, a high voltage is applied to the plasma generating electrode, and the plate-like electrode layer is a ground electrode.

The apparatus includes a driving unit. The driving unit is configured to rotate the circular surface discharge plasma module while the circular surface discharge plasma module is in a horizontal state. The specific method in which the circular surface discharge plasma module is rotated is not a characteristic of the present invention, and it will be recognized that various methods of rotating the circular surface discharge plasma module may be employed for the present invention.

The driving unit includes a rotational speed control unit. The rotational speed control unit is configured to control the speed at which the driving unit rotates the circular surface discharge plasma module. It will be recognized that various methods of controlling the speed at which the driving unit rotates the circular surface discharge plasma module may be employed for the present invention.

According to the powder plasma processing apparatus of the present invention, it is possible to perform uniform processing on the powder and to control the time that the powder spends in contact with the plasma, thereby allowing efficient powder processing to be performed.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which:

FIG. 1 is a perspective view illustrating a surface discharge plasma module of a powder plasma processing apparatus according to the present invention;

FIG. 2 is a side view of FIG. 1; and

FIG. 3 is a perspective view illustrating another example of the arrangement in which ground electrodes of the powder plasma processing apparatus according to the present invention are arranged

DETAILED DESCRIPTION OF EXEMPLARY EMBODIMENTS

A powder plasma processing apparatus according to embodiments of the present invention will be described in detail below with reference to the accompanying drawings. The present invention may be subjected to many changes and have several forms, and specific embodiments thereof are illustrated in the drawings and described in detail in the specification. However, it will be understood that the present invention is not intended to be limited to the specific forms set forth herein, and all changes, equivalents, and substitutions included in the technical scope and spirit of the present invention are included. Referring to the drawings, similar reference numerals are used to refer to similar components. In the accompanying drawings, the dimensions of the structures may be exaggerated for clarity.

Terms such as first, second, and the like may be used to describe various components, but these components should not be limited by the terms. The terms are used only for the purpose of distinguishing one component from another component. For instance, a first component may be referred to as a second component, or similarly, a second component may be referred to as a first component, without departing from the scope of the present invention.

Terms used herein are intended to only explain specific embodiments of the present invention, not to limit the invention. The singular forms "a," "an" and "the" are intended to include the plural forms as well, unless the context clearly indicates otherwise. It will be understood that the terms "comprises" or "have," when used in this specification, are intended to specify the presence of stated features, integers, steps, operations, components, a combination thereof, but do not preclude the presence or addition of one or more other features, integers, steps, operations, components, or a combination thereof.

Unless otherwise defined herein, all terms used in the present invention including technical or scientific terms have the same meanings as terms that are generally understood by those skilled in the art related to the field of the present invention. The same terms as those that are defined in a general dictionary should be understood to have the same meanings as contextual meanings of the related art. Unless the terms are explicitly defined in the present invention, the terms should not be interpreted with ideal or excessively formal meanings.

FIG. 1 is a perspective view illustrating a surface discharge plasma module of a powder plasma processing apparatus according to the present invention, and FIG. 2 is a side view of FIG. 1

Referring to FIGS. 1 and 2, a circular surface discharge plasma module 110 is employed as the powder plasma processing apparatus according to an embodiment of the present invention. The surface discharge plasma module 110 includes a plate-like electrode layer 111, an insulating layer 112, and plasma generating electrodes 113.

The plate-like electrode layer 111 forms an outer surface of the circular surface discharge plasma module 110.

The insulating layer 112 insulates the plate-like electrode layer 111 from the plasma generating electrodes 113, and the insulating layer 112 is formed at an inner surface side of the plate-like electrode layer 111. For example, the insulating layer 112 may be formed of a material such as MgO, $MgF_2$, LiF, $CaF_2$, alumina, glass, ceramic, magnesium oxide, and so forth.

A plurality of the plasma generating electrodes 113 are arranged on the insulating layer 112, and plasma is generated around the plasma generating electrodes 113. For example, the plasma generating electrodes 113 may be in the form of a bar and may protrude on the insulating layer 112. For example, the arrangement of the plasma generating electrodes 113 may be such that they are arranged at intervals in the circumferential direction of the circular surface discharge plasma module 110 or the plasma generating electrodes 113 may extend in the longitudinal direction of the surface discharge plasma module 110. As another example, referring to FIG. 3, the plasma generating electrodes 113 may be arranged at intervals in the longitudinal direction of the circular surface discharge plasma module 110 or the plasma generating electrodes 113 may extend in the circumferential direction of the circular surface discharge plasma module 110.

According to an embodiment of the present invention, a high voltage is applied to the plate-like electrode layer 111, and the plasma generating electrodes 113 are ground electrodes.

According to another embodiment of the present invention, the plate-like electrode layer 111 is a ground electrode, and a high voltage is applied to the plasma generating electrodes 113.

In this surface discharge plasma module 110, an alternating voltage is applied from the plasma power supply 120 to the plasma generating electrodes 113 and the plate-like electrode layer 111, and a plasma reaction gas is injected, thereby generating the plasma around the plasma generating electrodes 113. For example, a gas containing oxygen such as $O_2$ or $N_2O$, a gas containing fluorine such as $CF_4$ or $SF_6$, a gas containing chlorine such as $Cl_2$ or $BCl_3$, and an inert gas such as Ar or $N_2$ may be used alone or in combination as the plasma reaction gas.

In addition, both sides of the surface discharge plasma module 110 in the longitudinal direction may be opened, and a powder may be supplied and withdrawn (collected) through the opened sides. The surface treatment is performed on the powder by means of the plasma while the surface discharge plasma module 110 rotates.

The present invention includes a driving unit for rotating the surface discharge plasma module 110. Although not shown, the driving unit may have a form for rotating the surface discharge plasma module 110, for example, driving means such as a driving motor may be connected to the surface discharge plasma module 110. The driving unit is not specifically limited as long as it can rotate the surface discharge plasma module 110.

The driving unit includes a rotational speed control unit. The rotational speed control unit is configured to control the speed at which the circular surface discharge plasma module 110 is rotated. Although not shown, for example, the rotational speed control unit may be in the form of a control box or a programmable logic controller (PLC). The rotational speed control unit is not specifically limited to this configuration. When the rotational speed of the surface discharge plasma module 110 is adjusted, the time that the powder spends in contact with the plasma or the number of times the powder comes in contact with the plasma is adjusted.

Hereinafter, the procedure of processing the powder using the powder plasma processing apparatus according to the present invention will be briefly described.

The powder is injected into the surface discharge plasma module 110.

An alternating voltage is applied from the plasma power supply 120 to the plate-like electrode layer 111 and the plasma generating electrodes 113, and a reaction gas is injected, thereby generating the plasma around the plasma generating electrodes 113.

The surface discharge plasma module 110 is rotated by the driving unit.

When the surface discharge plasma module 110 is rotated, the powder within the surface discharge plasma module 110 rises and falls in the rotational direction of the rotating surface discharge plasma module 110. This procedure is repeated while the surface discharge plasma module 110 is rotated. In this case, the powder is in contact with the plasma.

The rotational speed of the surface discharge plasma module 110 may be adjusted if necessary.

When the powder plasma processing apparatus according to the embodiment of the present invention is employed, the surface discharge plasma module 110 is circular, and the powder is processed while the surface discharge plasma module 110 is rotated, thereby allowing the powder to be uniformly processed.

In addition, since the speed at which the circular surface discharge plasma module is rotated is adjusted, the time that the powder spends in contact with the plasma can be controlled.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

REFERENCE NUMERAL

110 Surface discharge plasma module
111 Plate-like electrode layer
112 Insulating layer
113 Plasma generating electrode
120 Plasma power supply

What is claimed is:

1. A method of processing a powder using a powder surface processing apparatus of a rotary cylindrical surface discharge plasma module:
   the apparatus comprising:
      a plate-like electrode layer serving as an external surface of the cylindrical surface discharge plasma module;
      an insulating layer disposed on an internal surface of the plate-like electrode layer; and
      a plurality of plasma generating electrodes in the form of a bar which are disposed on the insulating layer at intervals,
      wherein the cylindrical surface discharge plasma module is configured to rotate and the plate-like electrode layer, insulating layer, and plurality of plasma generating electrodes are configured to rotate with the cylindrical surface discharge plasma module, the cylindrical surface discharge plasma module is configured to apply an alternating voltage to the plurality of plasma generating electrodes and the plate-like electrode layer to generate plasma around the plurality of plasma generating electrodes, and the cylindrical surface discharge plasma module is configured to position a powder on the plasma generating electrodes and treat the surface of the powder by the generated plasma,
      wherein the apparatus comprises a driving unit configured to rotate the cylindrical surface discharge plasma module while the cylindrical surface discharge plasma module is in a horizontal state; and
   the method comprising:
      generating a plasma with the plasma generating electrodes of the powder surface processing apparatus;
      rotating the cylindrical surface discharge plasma module, plate-like electrode layer, insulating layer, and plurality of plasma generating electrodes; and
      contacting a powder with the plasma generated from the rotating plasma generating electrodes.

2. The method of claim 1, wherein the plasma is generated from a plasma reaction gas injected into the surface discharge plasma module.

3. The method of claim 2, wherein the plasma reaction gas comprises an inert gas and a gas containing oxygen, fluorine, or chlorine.

4. The method of claim 3, wherein the inert gas comprises Ar or $N_2$.

5. The method of claim 3, wherein the gas containing oxygen comprises $O_2$ or $N_2O$.

6. The method of claim 3, wherein the gas containing fluorine comprises $CF_4$ or $SF_6$.

7. The method of claim 3, wherein the gas containing chlorine comprises $Cl_2$ or $BCl_3$.

8. The method of claim 1, wherein a high voltage is applied to the plate-like electrode layer, and the plurality of plasma generating electrodes are ground electrodes.

9. The method of claim 1, wherein a high voltage is applied to the plurality of plasma generating electrodes, and the plate-like electrode layer is a ground electrode.

10. The method of claim 1, wherein the plurality of the plasma generating electrodes are arranged on the insulating layer at intervals in the circumferential direction of the surface discharge plasma module, and extend in the longitudinal direction of the surface discharge plasma module.

11. The method of claim 1, wherein the plurality of the plasma generating electrodes are arranged on the insulating layer at intervals in the longitudinal direction of the surface discharge plasma module, and extend in the circumferential direction of the surface discharge plasma module.

12. The method of claim 1, wherein the driving unit includes a rotational speed control unit configured to control the speed at which the driving unit rotates the cylindrical surface discharge plasma module.

* * * * *